(12) United States Patent
Hsu et al.

(10) Patent No.: US 8,558,384 B2
(45) Date of Patent: Oct. 15, 2013

(54) INTERCONNECT STRUCTURE CONTAINING VARIOUS CAPPING MATERIALS FOR ELECTRICAL FUSE AND OTHER RELATED APPLICATIONS

(75) Inventors: Louis L. Hsu, Fishkill, NY (US); William R. Tonti, Essex Junction, VT (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/537,879

(22) Filed: Jun. 29, 2012

(65) Prior Publication Data

US 2012/0261794 A1 Oct. 18, 2012

Related U.S. Application Data

(62) Division of application No. 13/052,662, filed on Mar. 21, 2011, now Pat. No. 8,232,649, which is a division of application No. 12/118,186, filed on May 9, 2008, now Pat. No. 7,956,466.

(51) Int. Cl.
  *H01L 23/48* (2006.01)
  *H01L 23/52* (2006.01)
  *H01L 29/40* (2006.01)

(52) U.S. Cl.
  USPC ............ 257/758; 257/E21.019; 257/E21.579; 257/E23.142; 257/E23.145

(58) Field of Classification Search
  USPC ........... 257/758, E21.019, E21.579, E23.142, 257/E23.145
  See application file for complete search history.

(56) References Cited

U.S. PATENT DOCUMENTS

| | | | |
|---|---|---|---|
| 5,585,673 A | 12/1996 | Joshi et al. | |
| 5,695,810 A | 12/1997 | Dubin et al. | |
| 5,930,667 A * | 7/1999 | Oda | 438/622 |
| 6,180,503 B1 | 1/2001 | Tzeng et al. | |
| 6,225,210 B1 | 5/2001 | Ngo et al. | |
| 6,323,554 B1 | 11/2001 | Joshi et al. | |
| 6,342,733 B1 | 1/2002 | Hu et al. | |
| 6,362,024 B1 | 3/2002 | Kotou et al. | |
| 6,541,850 B2 | 4/2003 | Duesman et al. | |
| 6,555,458 B1 | 4/2003 | Yu | |
| 6,605,874 B2 | 8/2003 | Leu et al. | |
| 6,706,625 B1 | 3/2004 | Sudijono et al. | |
| 6,730,982 B2 | 5/2004 | Barth et al. | |
| 6,764,951 B1 | 7/2004 | van Ngo | |
| 6,897,144 B1 | 5/2005 | Ngo et al. | |
| 7,009,222 B2 | 3/2006 | Yang | |
| 7,122,900 B2 | 10/2006 | Takeda et al. | |
| 7,176,126 B2 * | 2/2007 | Oh et al. | 438/638 |
| 7,183,195 B2 * | 2/2007 | Lee et al. | 438/622 |
| 7,214,594 B2 | 5/2007 | Wong et al. | |

(Continued)

OTHER PUBLICATIONS

Ex Parte Quayle Action dated Aug. 6, 2013 in related U.S. Appl. No. 13/780,471, 6 pages.

*Primary Examiner* — Ida M Soward
(74) *Attorney, Agent, or Firm* — Anthony Canale; Roberts Mlotkowski Safran & Cole, P.C.

(57) ABSTRACT

A design structure is provided for interconnect structures containing various capping materials for electrical fuses and other related applications. The structure includes a first interconnect structure having a first interfacial structure and a second interconnect structure adjacent to the first structure. The second interconnect structure has second interfacial structure different from the first interfacial structure.

6 Claims, 11 Drawing Sheets

(56) References Cited

U.S. PATENT DOCUMENTS

| | | | |
|---|---|---|---|
| 7,239,004 B2 | 7/2007 | Park et al. | |
| 7,285,474 B2 | 10/2007 | Anderson et al. | |
| 7,323,760 B2 | 1/2008 | Sakoh | |
| 7,361,991 B2* | 4/2008 | Saenger et al. | 257/750 |
| 7,365,001 B2* | 4/2008 | Yang et al. | 438/622 |
| 7,402,463 B2 | 7/2008 | Yang et al. | |
| 7,435,618 B2* | 10/2008 | Chen et al. | 438/106 |
| 7,439,623 B2 | 10/2008 | Harada | |
| 7,488,682 B2* | 2/2009 | Yang | 438/627 |
| 7,501,347 B2 | 3/2009 | Noguchi et al. | |
| 7,517,763 B2 | 4/2009 | Park et al. | |
| 7,538,353 B2* | 5/2009 | Huang et al. | 257/77 |
| 7,572,682 B2 | 8/2009 | Yang et al. | |
| 7,586,196 B2 | 9/2009 | Dubin et al. | |
| 7,602,027 B2 | 10/2009 | Burke et al. | |
| 7,622,364 B2 | 11/2009 | Adkisson et al. | |
| 7,671,444 B2 | 3/2010 | Wang et al. | |
| 7,728,432 B2 | 6/2010 | Takewaki et al. | |
| 7,732,922 B2 | 6/2010 | Yang et al. | |
| 7,785,934 B2 | 8/2010 | Hsu et al. | |
| 7,800,228 B2* | 9/2010 | Yang et al. | 257/758 |
| 7,956,466 B2* | 6/2011 | Hsu et al. | 257/758 |
| 7,960,808 B2 | 6/2011 | Burr et al. | |
| 7,968,966 B2 | 6/2011 | Hotta et al. | |
| 7,968,967 B2 | 6/2011 | Wang et al. | |
| 7,989,913 B2 | 8/2011 | Ueda | |
| 8,030,733 B1 | 10/2011 | Naem | |
| 8,138,083 B2* | 3/2012 | Yang et al. | 438/618 |
| 8,159,042 B2 | 4/2012 | Yang et al. | |
| 8,232,190 B2 | 7/2012 | Bernstein et al. | |
| 8,264,062 B2 | 9/2012 | Watanabe | |
| 2001/0030366 A1 | 10/2001 | Nakano et al. | |
| 2002/0149105 A1 | 10/2002 | Yoon et al. | |
| 2003/0001267 A1 | 1/2003 | Watanabe | |
| 2003/0227089 A1 | 12/2003 | Watanabe et al. | |
| 2004/0113279 A1 | 6/2004 | Chen et al. | |
| 2004/0145855 A1 | 7/2004 | Block et al. | |
| 2004/0207092 A1 | 10/2004 | Burrell et al. | |
| 2006/0017153 A1 | 1/2006 | Choi | |
| 2006/0118963 A1 | 6/2006 | Yamada | |
| 2007/0001307 A1 | 1/2007 | Usui et al. | |
| 2007/0032067 A1 | 2/2007 | Nakashima | |
| 2007/0155172 A1 | 7/2007 | Lai et al. | |
| 2007/0161290 A1 | 7/2007 | Fitzsimmons et al. | |
| 2007/0254470 A1 | 11/2007 | Jung | |
| 2007/0273002 A1 | 11/2007 | Hwang | |
| 2008/0054398 A1 | 3/2008 | Lin et al. | |
| 2008/0067627 A1 | 3/2008 | Boeck et al. | |
| 2008/0174022 A1* | 7/2008 | Chen et al. | 257/752 |
| 2008/0206978 A1 | 8/2008 | Hsu et al. | |
| 2009/0085152 A1 | 4/2009 | Bernstein et al. | |
| 2009/0174075 A1 | 7/2009 | Yang et al. | |
| 2009/0243113 A1 | 10/2009 | Tuten et al. | |
| 2009/0261450 A1 | 10/2009 | Cheng et al. | |
| 2009/0294902 A1 | 12/2009 | Yoshimura et al. | |
| 2010/0090751 A1 | 4/2010 | Cheng et al. | |
| 2012/0276732 A1 | 11/2012 | Lin et al. | |

* cited by examiner

An Interconnect Containing 2 Different Cap Materials

US 8,558,384 B2

INTERCONNECT STRUCTURE CONTAINING VARIOUS CAPPING MATERIALS FOR ELECTRICAL FUSE AND OTHER RELATED APPLICATIONS

CROSS REFERENCE TO RELATED APPLICATIONS

The present application is a divisional application of copending U.S. application Ser. No. 13/052,662 filed on Mar. 21, 2011, which is a divisional application of Ser. No. 12/118,186 filed on May 9, 2008, the contents of all of which are incorporated by reference in their entirety herein.

FIELD OF THE INVENTION

The invention relates to FINFET and method manufacture, and more particularly, to a design structure for interconnect structures containing various capping materials for electrical fuses and other related applications.

BACKGROUND

A fuse is a structure that is blown in accordance with a suitable electrical current. For example, an electrical current is provided through the fuse to eventually provide an open circuit condition. In integrated circuitry memory devices, fuses can be used for activating redundancy in memory chips and for programming functions and codes in logic chips. Specifically, dynamic random access memory (DRAM) and static random access memory (SRAM) employ fuses for such purposes.

Electronic fuses can also be used to prevent reduction of yield, which may be caused by random defects, generated in the manufacturing process. Moreover, fuse links provide for voltage options, packaging pin out options, or any other option desired by the manufacturer to be employed prior to the final processing. This helps increase yield and makes it easier to use one basic design for several different end products.

Some electrically blowable fuses take advantage of the electromigration (EM) effect to open an electrical connection. For example, EM is the transport of material caused by the gradual movement of ions in a conductor due to the momentum transfer between conducting electrons and diffusing metal atoms. In electrically blowable fuses that take advantage of EM effect, such transport of material caused by the gradual movement of ions can open the electrical connection.

However, in a typical e-fuse the EM effect causes undesirable hillocks. More specifically, known e-fuses comprise a two-dimensional dog-bone shape having a small cross-sectional area between large cathode and anode pads. During programming, voids form at the center fuse element due to high current density, and eventually create an electrically open circuit. However, the electromigration causes the conductive material to pile-up and form hillocks at the anode end of the fuse element. Hillock formation is an undesirable effect that has not been exploited for any useful purpose.

Accordingly, there exists a need in the art to overcome the deficiencies and limitations described hereinabove.

SUMMARY

In a first aspect of the invention, a structure comprises a first interconnect structure having a first interfacial structure and a second interconnect structure adjacent to the first structure. The second interconnect structure has second interfacial structure different from the first interfacial structure.

In another aspect of the invention, a structure comprises a wiring interconnect structure having an interface comprising a metal wiring layer and a capping layer of a first material type. The structure further comprises an electronic fuse interconnect structure having an interface comprising a metal wiring layer and a capping layer of a second material type.

In yet another aspect of the invention, a structure comprises a first macro having a metal wiring layer on a first level electrically connected to a metal wiring layer on a second layer and a capping layer over the metal wiring layer on the second layer which has a first electromigration (EM) resistance. The structure further comprises a second macro adjacent the first macro. The second macro has a metal wiring layer on the first level electrically connected to a metal wiring layer on the second layer and a capping layer over the metal wiring layer on the second layer which has a second electromigration (EM) resistance different from the first electromigration (EM) resistance.

In still a further aspect of the invention, an interconnect structure comprises a first macro having a first e-fuse programmability comprising an upper wiring layer capped by a capping material. The interconnect structure further comprises a second macro having a second e-fuse programmability comprising an upper wiring layer capped by a capping material having interfacial properties which are different than that of the first macro.

In a further aspect of the invention, a design structure for e-fuse and interconnect structures is embodied in a machine-readable medium for designing, manufacturing, or testing an integrated circuit. The design structure comprises a first interconnect structure having a first interfacial structure and a second interconnect structure adjacent to the first structure. The second interconnect structure has second interfacial structure different from the first interfacial structure.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to a design structure, and more particularly, to a design structure for interconnect structures containing various capping materials for electrical fuses (e-fuses)

and other related applications. More specifically, the present invention teaches interconnect structures, which may be implemented as either normal interconnects or e-fuses. The structures include various capping layer materials at an interface with a metal wiring layer to provide different interfacial properties, e.g., EM resistance.

Advantageously, the formation of the interconnect structure and e-fuses of the present invention can be implemented in FEOL, BEOL, and FBEOL, and are compatible with current process flows. The present invention thus allows the building of e-fuses during normal interconnect process flows, advantageously reducing processing costs for manufacturing e-fuses which are normally fabricated in different process flows. Also, in accordance with different embodiments, depending on the materials used herein (as discussed in detail below) the e-fuse can be programmed to blow at different current levels. EM effects in the e-fuses of the present invention will not cause undesirable hillocks at the anode end of the fuse element.

Figure 1:
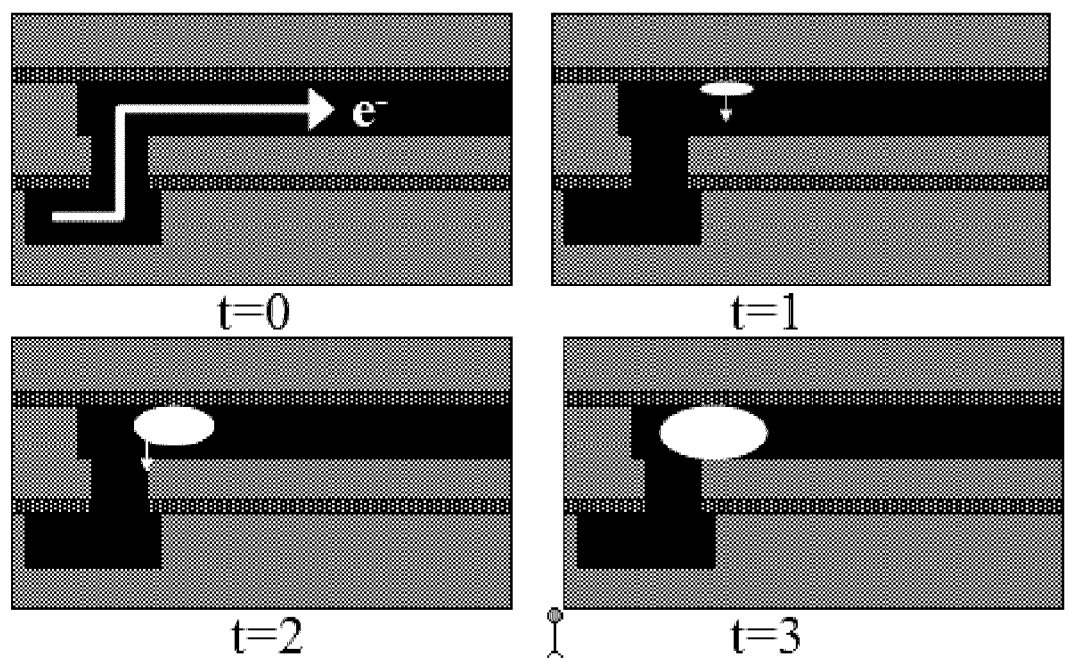
FIG. 1 shows the formation of void nucleation sites.

By way of example, FIG. 1 shows an EM failure mode in an interconnect structure (or an e-fuse in accordance with the invention). Generally, three major diffusion paths have been identified in the EM failure mechanism. These failure mechanisms can be, for example, Cu/capping layer interface;
Cu grain boundary; and
Cu/barrier (Ta) interface.

The dominant diffusion path depends on the process. For example, in certain products/processes, the Cu/capping layer interface is the most critical interface controlling the EM performance.

More specifically, multilayer electronic components comprise multiple layers of a dielectric material having metallization on each layer in the form of vias, pads, straps connecting pads to vias and wiring. Vias or other openings in the dielectric layer extend from one layer to another layer. These openings are filled with a conductive material and electrically connect the metallization on one layer to the metallization on another layer and provide for the high-density electronic components devices now used in industry. Metallization metal may be formed using a filling technique such as electroplating, electroless plating, chemical vapor deposition, physical vapor deposition or a combination of methods. The metal wiring is capped with a dielectric capping layer, which may be, for example, nitride.

As shown in FIG. 1, at t=0, the electrons are shown to be moving through the wiring pattern, However, as time passes, voids (void nucleation sites) begin to form at the interface between the upper wiring layer and the dielectric capping layer. At t=3, for example, the void becomes so large that it effectively opens the circuit thus resulting in a failure of the wiring layer. In the case of a fuse, this open circuit is a blown fuse.

Figure 2:
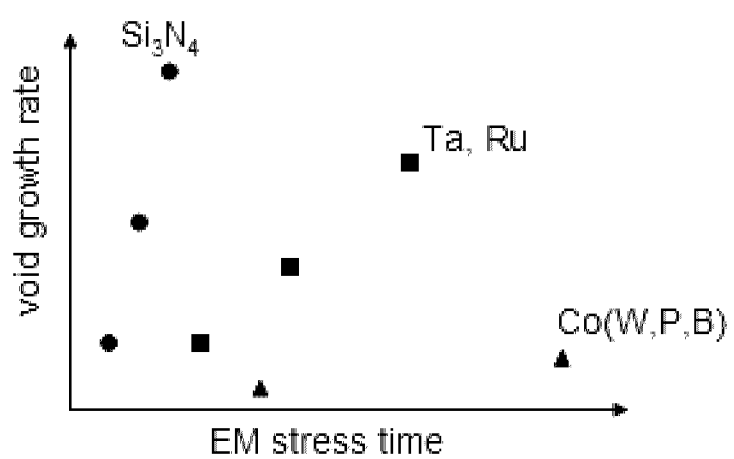
FIG. 2 shows a graph of different void growth rates for cap interface materials in accordance with the invention.

FIG. 2 shows a graph of different void growth rates for cap interface materials used in accordance with the invention. More specifically, FIG. 2 shows a graph of different void growth rates over EM stress time. After extensive experimentation, it has been found that different void growth rates are provided with different Cu/cap interface materials. As important, it was found that EM resistance behaves differently between different capping materials.

In particular, as shown in FIG. 2, SiN ($Si_3N_4$) shows the fastest void growth rate over EM stress time. Ta and Ru show a slower void growth rate over EM stress time, with any combination of Co(W, P, B) showing the slowest void growth rate over EM stress time. Although Ta and Ru and any combination of Co(W, P, B) are shown grouped together, respectively, those of skill in the art should be understood that these materials will also have certain variations in void growth rate.

With the data shown in FIG. 2, in a regular interconnect, it is possible to select a good Cu/capping layer interface (e.g., SiN) to prevent the formation of void nucleation sites. However, it is also desirable to select poor interface materials (e.g., Ta, Ru and any combination of Co(W, P, B)) for e-fuse applications. As such, in accordance with the invention, by creating various interfaces which result in different EM resistance during same process flows, it is now possible to fabricate an e-fuse application using process flows of an interconnect structure. This now being possible, the invention contemplates programmable e-fuses using different capping materials and, in embodiments, by damaging existing capping materials, any of which exhibit differences in EM resistance when used as a Cu capping layer. Also, the present invention should not be limited to the above materials, in that other materials, e.g., Rh and Pt, will provide different void growth rates for cap interface materials in accordance with the invention.

Methods in Accordance with the Invention

Figure 3:
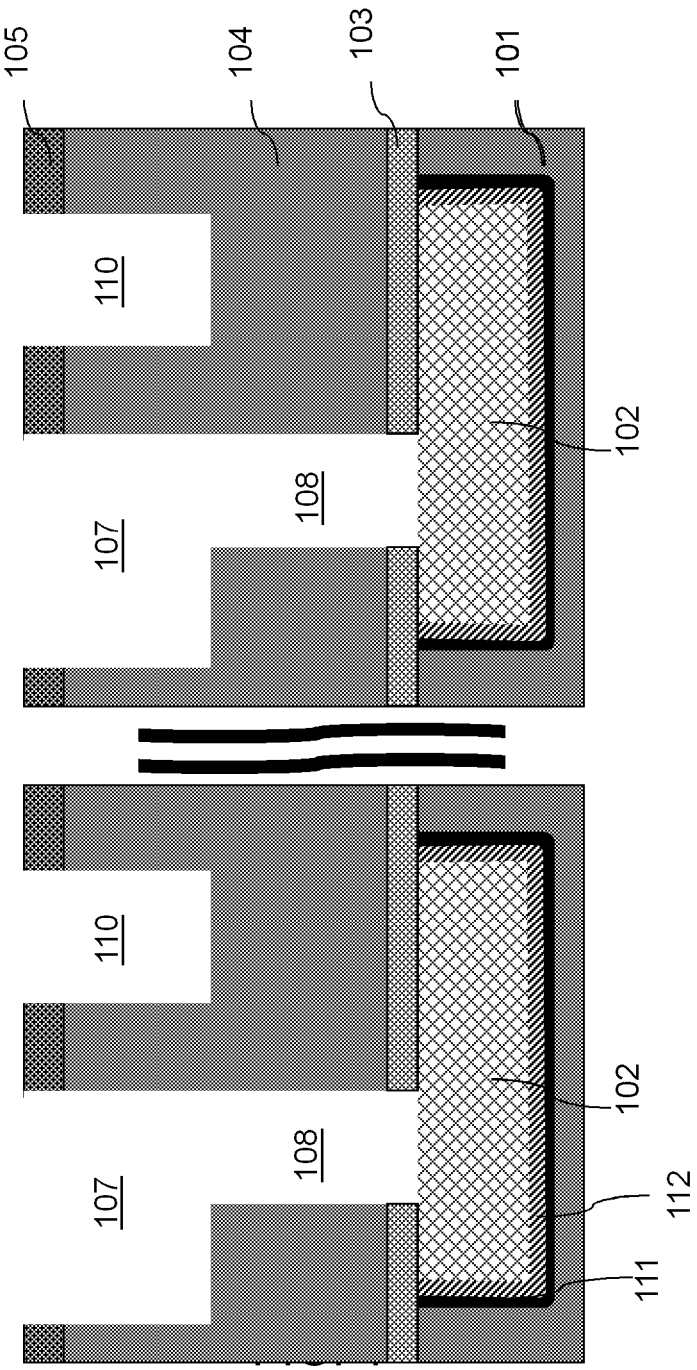
FIG. 3 shows a beginning structure and respective processing steps in accordance with the invention.

FIG. 3 shows a beginning structure and respective processing steps in accordance with the invention. In particular, FIG. 3 shows identical macros, Macro A and Macro B. The Macro A and Macro B will eventually be formed into two or more different structures having different programming efficiencies, implemented as e-fuses or wiring interconnect structures, for example.

Macro A and Macro B include a dielectric layer 101. The dielectric layer 101 may be, for example, $SiO_2$, $Si_3N_4$, SiCOH, SiLK, JSR, or porous dielectrics. The dielectric layer 101 could be any interconnect layer in the structure. In conventional lithographic and etching processes, a trench is formed in the dielectric layer 101. Materials are then deposited in the trench in conventional deposition processes to form an underlying metal interconnect 102. For example, a barrier/liner material 111 such as TaN is deposited in the trench. A barrier/liner material 112, e.g., Ta is deposited over the barrier/liner material 111. A metal interconnect material 102 is deposited over the barrier/liner material 112. The metal interconnect material 102 may be, for example, Cu, Al, Al(Cu) or W to name a few.

Still referring to FIG. 3, a dielectric capping layer 103 is deposited over the structure, in a conventional deposition process such as, for example, chemical vapor deposition. The dielectric capping layer 103 may be, for example, $Si_3N_4$, SiC, SiC(N,H) or other known capping materials. A dielectric layer 104 is deposited over the capping layer 103 in a conventional deposition process. The dielectric layer 104 may be, for example, $SiO_2$, $Si_3N_4$, SiCOH, SiLK, JSR, or porous dielectrics. A hard mask 105 is then deposited over the dielectric layer 104. The hard mask 105 may be, for example, $SiO_2$, $Si_3N_4$.

Via 108 and trenches 107 and 110 are formed in the structure in accordance with conventional trench or via formation processes. For example, a conventional dual damascene process and a single damascene process can be used to form the features 107, 108, 110. More specifically, a conventional lithographic and etching (e.g., RIE) process can be used to form the feature 108 and a second conventional lithographic and etching process can be used to form the features 107, 110. The formation of via 108 exposes the underlying interconnect 102.

Figure 4:
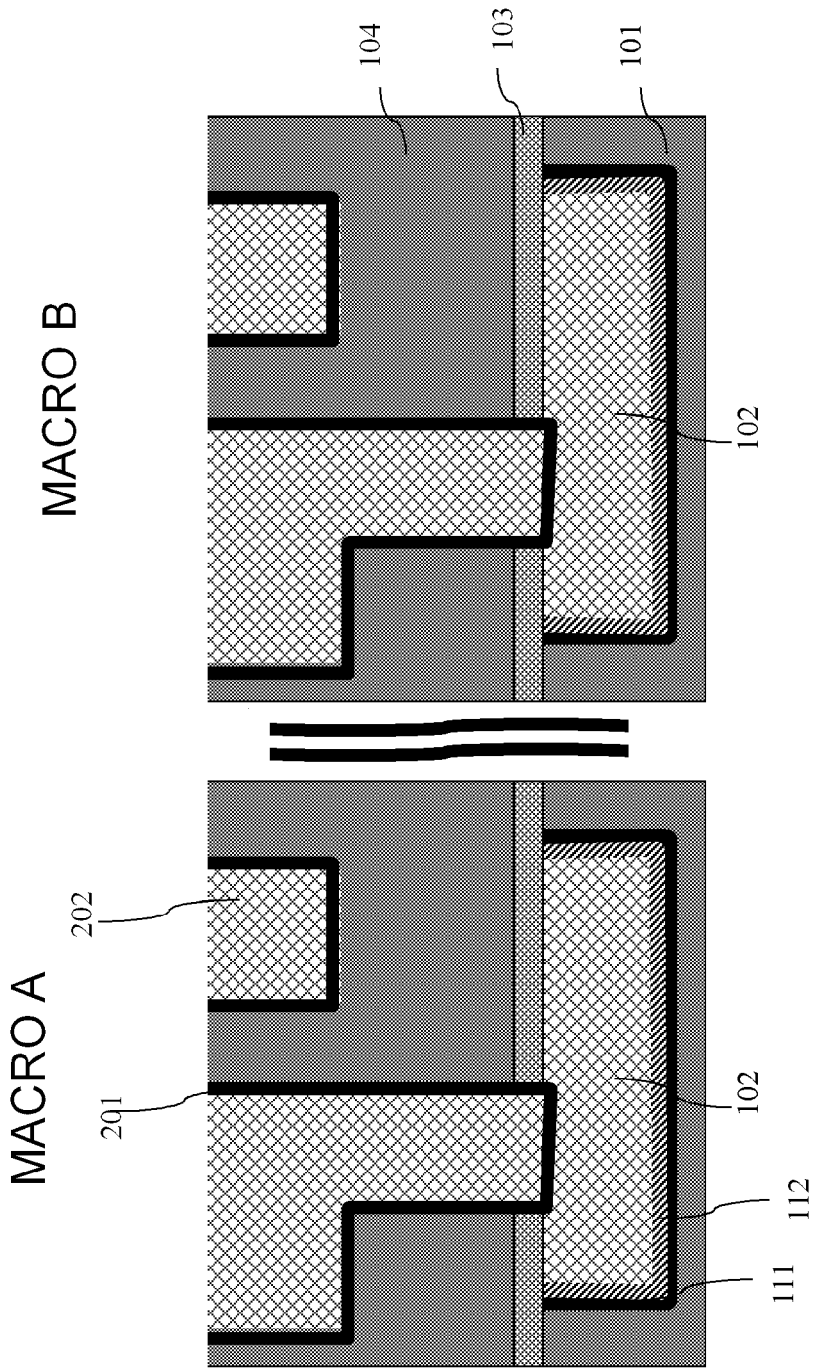
FIGS. 4-6 show intermediate structures and respective processing steps in accordance with the invention.
Figure 5:
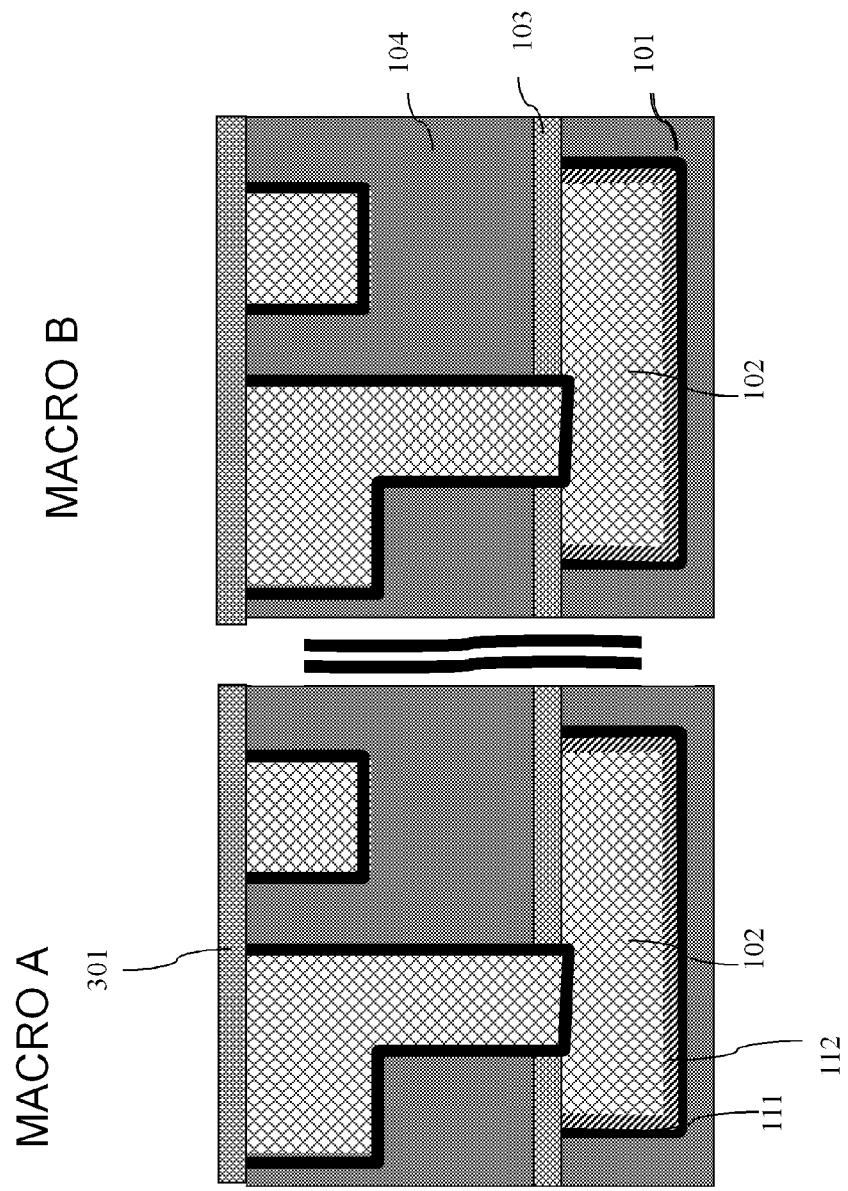
Figure 6:
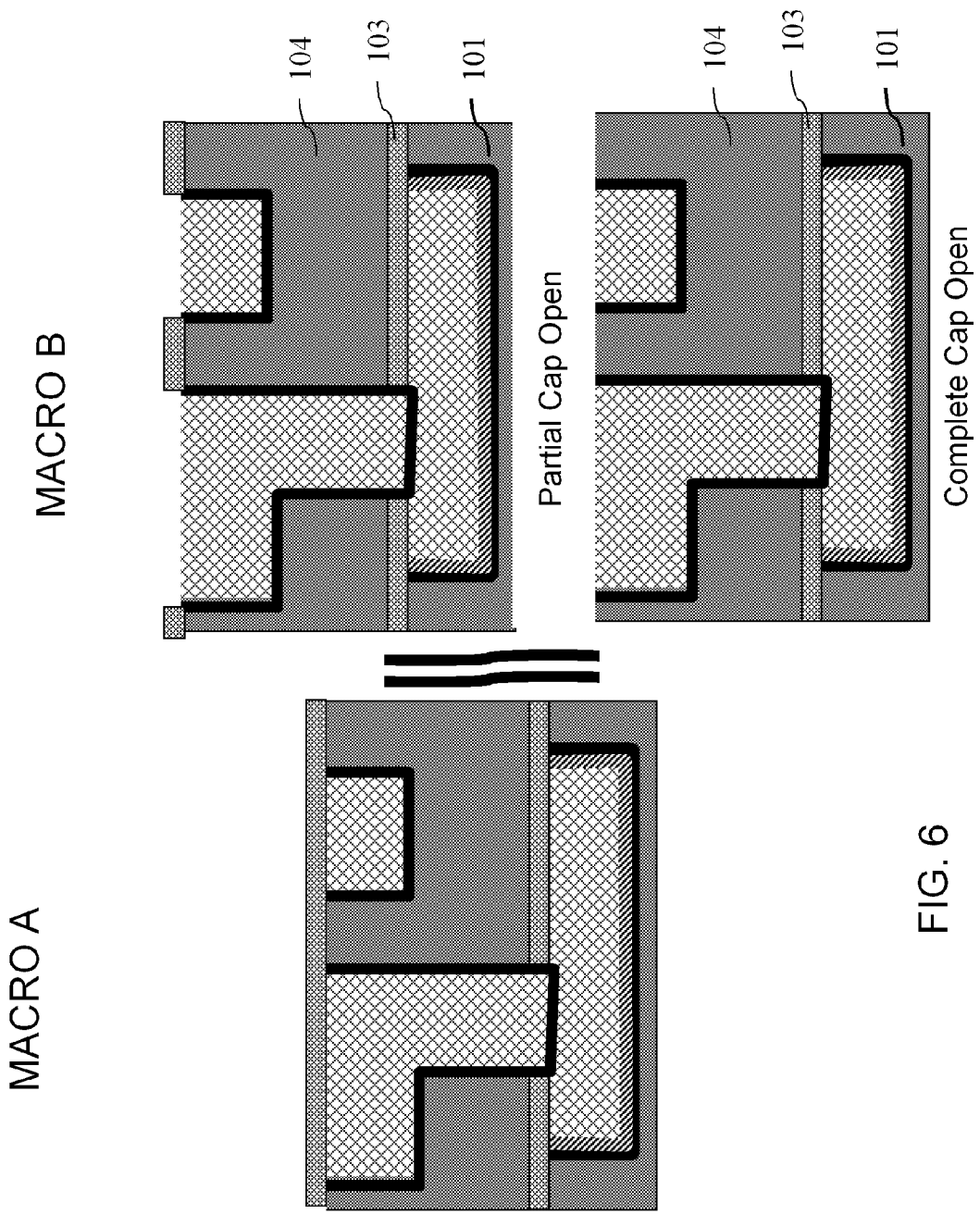

FIGS. 4-6 show intermediate structures and respective processing steps in accordance with the invention. In FIG. 4, for example, a liner 201 is formed on the sidewalls of the features

107, 108, 110. The liner 201 may be, for example, Ta(N), Ti(N), RuTa(N) or IrTa(N). In further processing steps, copper material is deposited in the structures 107, 108, 110 and over the liner 210 to form a metal interconnect 202. A conventional chemical mechanical polishing step may be provided to remove any extra conducting material 202 from the structure, e.g., polish the structure.

FIG. 5 shows a dielectric capping layer deposition process in accordance with the invention. In this processing step, a capping layer 301 is deposited over the structures (Macro A and Macro B) of FIG. 4. The capping layer 301 may be, for example, $Si_3N_4$ or SiC(N,H). In embodiments, the capping layer 310 is about 100 Å to 800 Å.

FIG. 6 shows alternate processing steps for Marco B. In particular, in Macro B, the capping layer 301 can be partially or completely removed using conventional etching processes. In the partial removal scenario, the capping layer 301 preferably is removed over the metal interconnect 202, remaining over the dielectric layer 104. In embodiments, Macro A remains protected by a mask during the etching of the capping layer 301 on Macro B.

Figure 7:
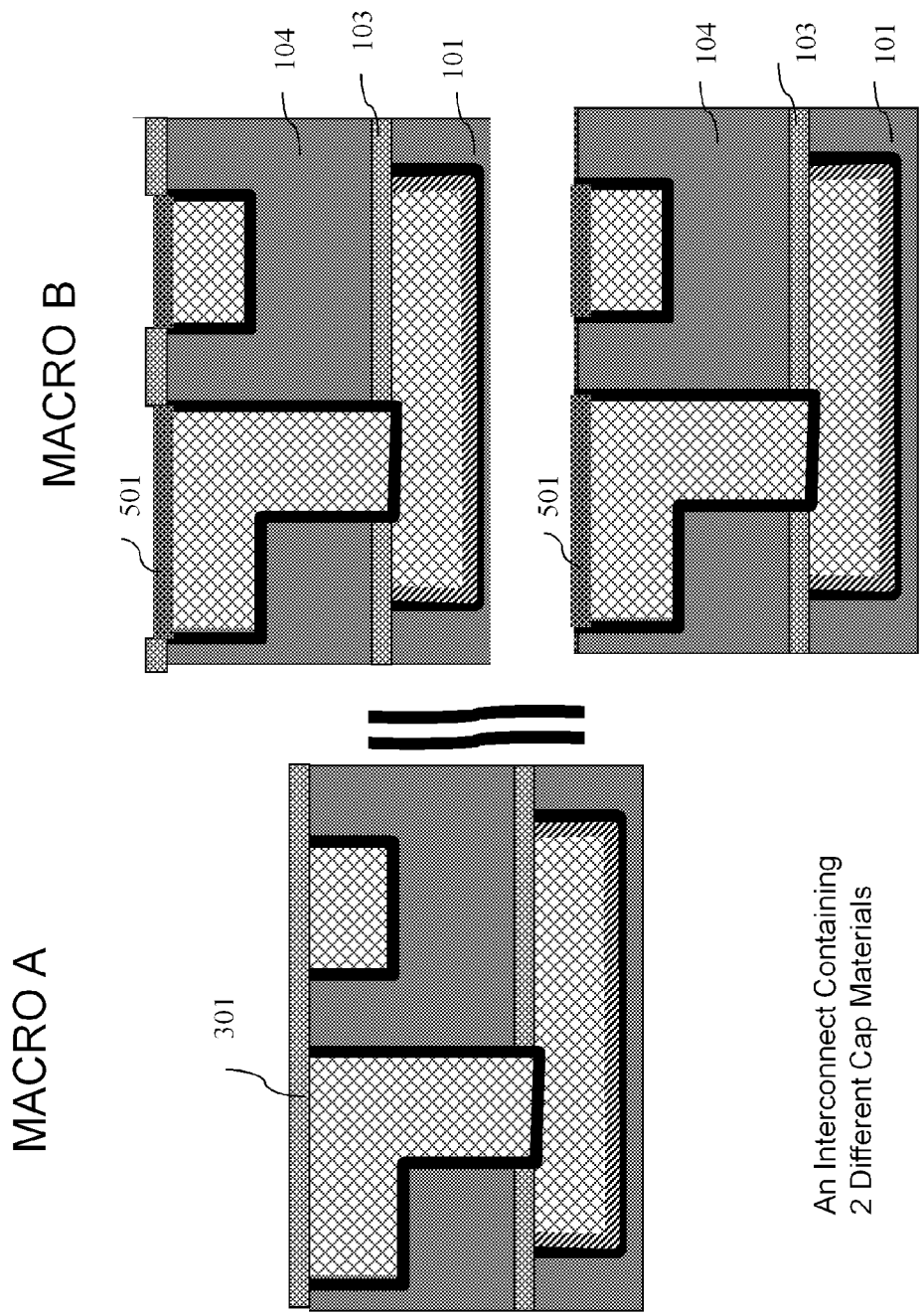
FIG. 7 shows alternative final structures and respective processing steps in accordance with the invention.

FIG. 7 shows a selective metal cap deposition on the alternative Macro B structures of FIG. 6. During this process, Macro A remains masked. The selective metal cap deposition 501 of the alternative Macro B structures include, for example, Co(W, P, B), Ru, Ir, Rh or Pt. The metal cap deposition 501 may be about 5 Å to 500 Å. The metal cap deposition process could be through CVD, ALD, electro plating, and electroless plating process. Those of skill in the art will understand that the metal cap deposition 501 may be other materials, depending on the desired programming efficiencies of the e-fuse. In embodiments, if the metal cap deposition is not selective, it is possible to provide a CMP touch up process to remove any unwanted deposition metals 501.

Figure 8:
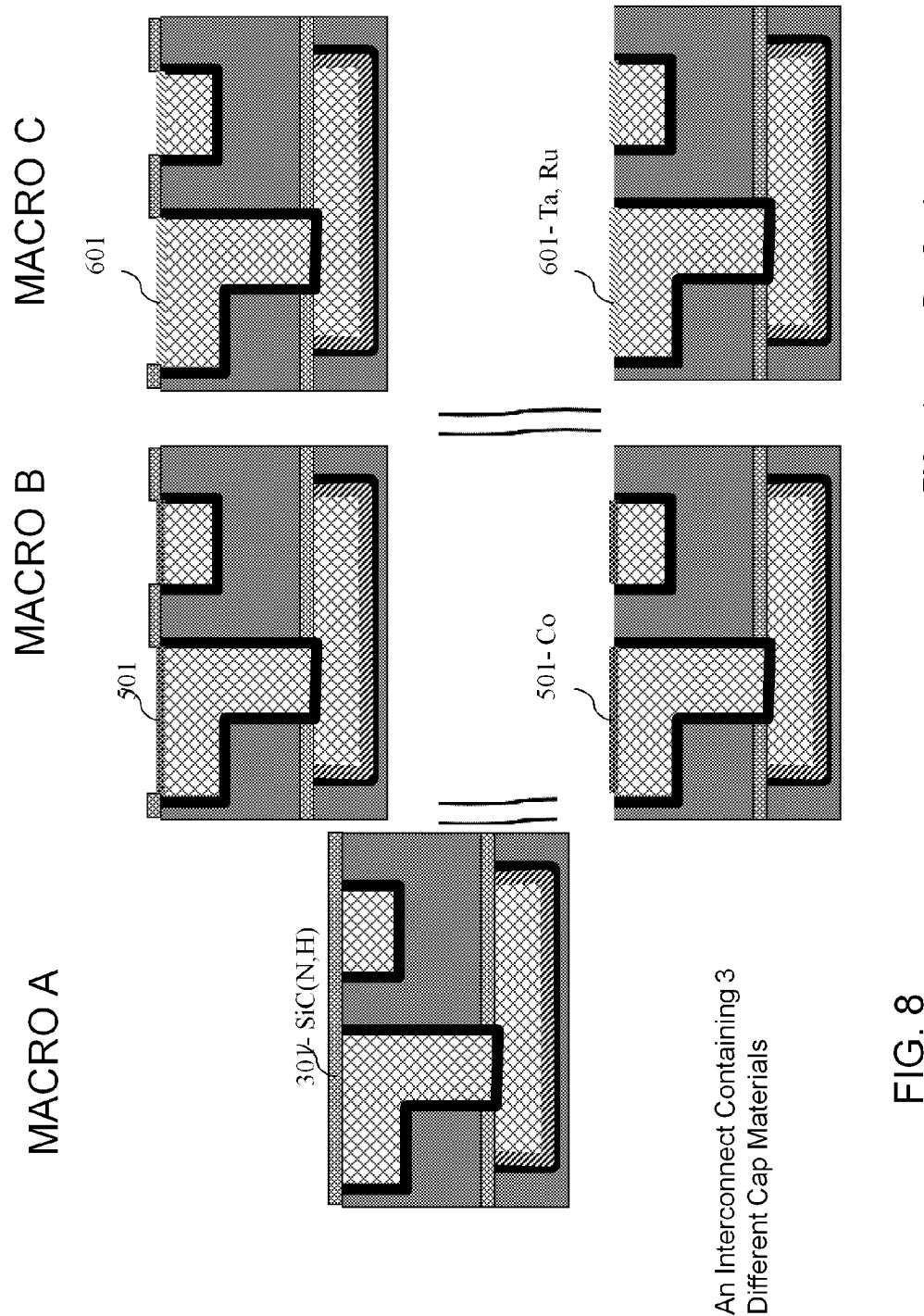
FIG. 8 shows alternative final structures and respective processing steps in accordance with the invention.

FIG. 8 shows a third macro, Macro C, provided in accordance with the invention. Macro C can be formed simultaneously with Marcos A and B in accordance with the processing steps of FIGS. 3-6. In this embodiment, a metal cap deposition material 601 is deposited over Macro C, while Macros A and B remain protected by a mask. The cap deposition material 601 on Macro C is different than the metal cap deposition material 501 (described with reference to FIG. 7) on Macro B. By way of one NON-LIMITING example, the metal cap deposition material 501 is Co and the metal cap deposition material 601 is Ru; although other combinations of materials (and/or combinations of partial or complete openings) are also contemplated by the invention.

In the illustrative embodiment shown in FIG. 8, Macro B has a greater EM resistance than Macro C and Macro A. Macro C has a greater EM resistance than Macro A. As such, Macro A has greater fuse efficiency than Macro B and Macro C. Also, Macro B has greater fuse efficiency than Macro C.

As thus shown in the exemplary representation of FIG. 8, different cap materials, i.e., different Cu/cap interfaces, results in different EM resistance, i.e. different EM life time. This being the case, Macros with a poor interface can be used as an e-fuse, and Macros with a good interface can be used as the normal interconnect. Also, using any combination of Macros (and combinations of materials and openings), it is possible to have different e-fuses (with different programmability) made on the same device using substantially the same processing. In this way, the multi-interface structure may provide circuit programming.

Figure 9:
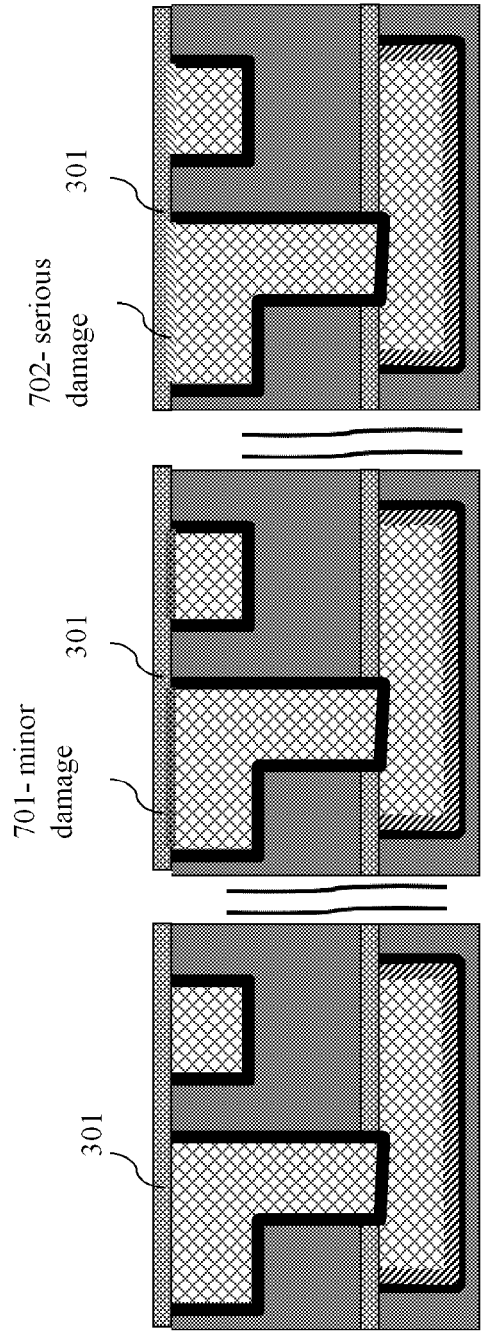
FIG. 9 shows alternative final structures and respective processing steps in accordance with the invention.

FIG. 9 shows a second embodiment in accordance with the invention. In this embodiment, Macros A, B and C have the same dielectric cap material 301. However, Macros B and C are subjected to different amount/degree of treatments, either prior or post the cap material 301 deposition, to degrade the interfacial property between the metal and the dielectric cap layer, e.g., adhesion. The treatment includes radiation sources such as e-beam, ultraviolet light, visible light, or laser light for altering the interfacial property discussed above. FIG. 9 can equally be representative of two (or more) Macros, with different treatments or in combination with different treatments and materials as described already herein.

In FIG. 9, area 701 on Macro B is provided with minor damage; whereas, Macro C has serious damage 702. In this illustrative embodiment, Macro A has a greater EM resistance than Macro B and Macro C. Macro B has a greater EM resistance than Macro C. As such, Macro C has greater fuse efficiency than Macro B and Macro A. Also, Macro B has greater fuse efficiency than Macro A.

Again, as in the previous embodiments, the advantage of the embodiment of FIG. 9 is to create different Cu/cap interfaces, which results in different EM resistance, i.e., different EM life time. The Macros with poor interface properties can be used as e-fuses, while the Macros with good interface properties can be used as normal interconnects. Also, this multi-interface structure can have potential on circuit programming.

Figure 10:
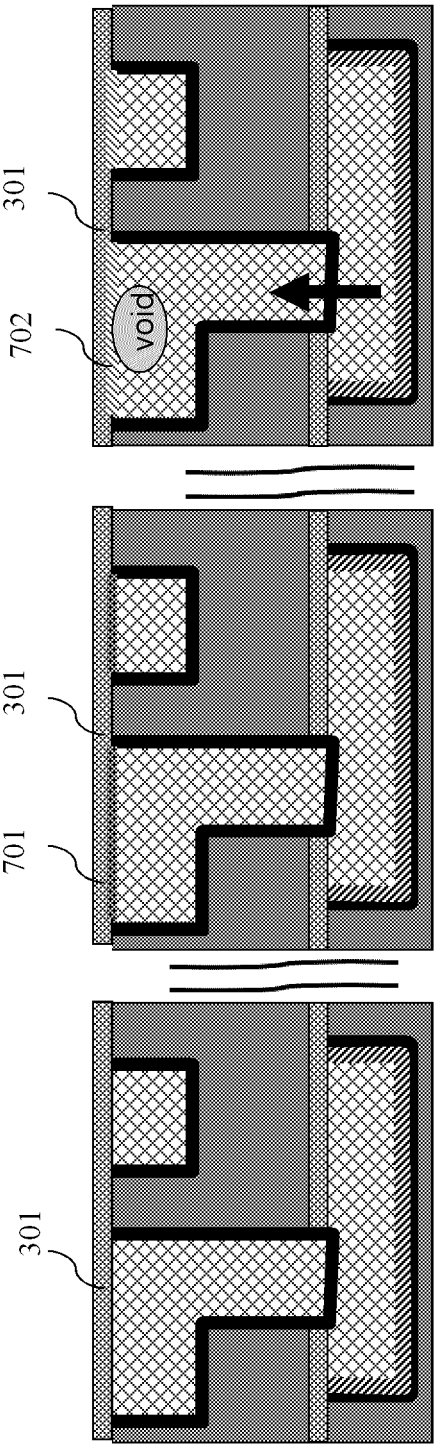
FIG. 10 shows a final structure with the formation of a void nucleation site in accordance with the invention.

FIG. 10 shows formation of void nucleation sites in structures fabricated in accordance with the invention. More particular, FIG. 10 illustratively shows void formation in the embodiment of FIG. 9. More specifically, void formation (i.e., an open circuit) due to EM effects is shown in the serious damage area 702 of Macro C. The void formation will effectively blow the fuse.

Design Structure

Figure 11:
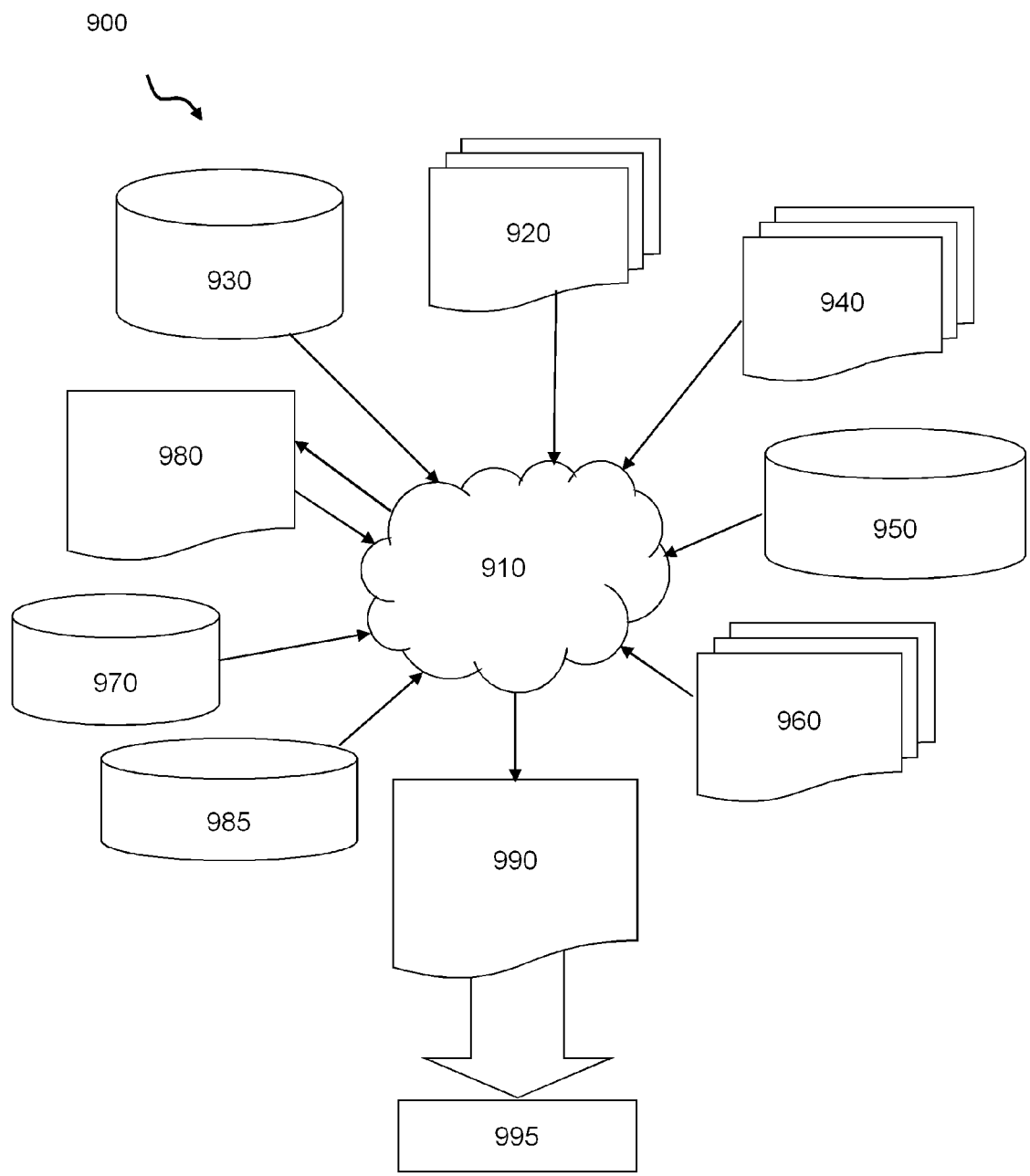
FIG. 11 is a flow diagram of a design process used in semiconductor design, manufacture, and/or test.

FIG. 11 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 7-9 in the form of schematics or HDL, a hardware-description language (e.g., Verilog, VHDL, C, etc.). Design structure 920 may be contained on one or more machine-readable media. For example, design structure 920 may be a text file or a graphical representation of an embodiment of the invention as shown in FIGS. 7-9. Design process 910 preferably synthesizes (or translates) embodiments of the invention as shown in FIGS. 7-9 into a netlist 980, where netlist 980 is, for example, a list of wires, transistors, logic gates, control circuits, I/O, models, etc. that describes the connections to other elements and circuits in an integrated circuit design and recorded on at least one of machine readable media. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 7-9, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce embodiments of the invention as shown in FIGS. 7-9. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of embodiments, those of skill in the art will recognize that the invention can be practiced with modifications and in the spirit and scope of the appended claims.

What is claimed is:

1. A structure comprising:
a first macro having a metal wiring layer on a first level electrically connected through an opening in a first capping layer to a metal wiring layer on a second layer and a second capping layer over the metal wiring layer on the second layer which has a first electromigration (EM) resistance; and
a second macro having a metal wiring layer on the first level electrically connected through an opening in a first capping layer to a metal wiring layer on the second layer and a second capping layer over the metal wiring layer on the second layer which has a second electromigration (EM) resistance different from the first electromigration (EM) resistance.

2. The structure of claim 1, wherein the second capping layer of the first macro is SiN and the second capping layer of the second macro is one of Co(W,P,B), Ru, Ir, Rh and Pt.

3. The structure of claim 1, wherein the second capping layer of the first and the second macro is a same material, and the second capping layer of the second macro and/or the metal wiring layer on the second layer of the second macro is damaged thereby providing a degraded electromigration (EM) resistance than that of the first macro.

4. The structure of claim 3, wherein the second capping layer of the second macro and/or the metal wiring layer on the second layer of the second macro is damaged to degrade adhesion between the second capping layer of the second macro and the metal wiring layer on the second layer of the second macro.

5. The structure of claim 4, wherein the second capping layer of the second macro and/or the metal wiring layer on the second layer of the second macro is damaged by radiation.

6. The structure of claim 5, wherein the radiation is provided by an e-beam, a ultraviolet light, a visible light, or a laser light.

* * * * *